United States Patent [19]

Conners et al.

[11] Patent Number: 4,459,995
[45] Date of Patent: Jul. 17, 1984

[54] INDICATING DEVICE FOR USE IN A DEVICE FOR MEASURING AND INDICATING CHANGES IN RESISTANCE OF A LIVING BODY

[75] Inventors: Ron Conners, Los Angeles; John McCormick, Grass Valley, both of Calif.

[73] Assignee: Lafayette R. Hubbard, Sussex, England

[21] Appl. No.: 304,594

[22] Filed: Sep. 22, 1981

Related U.S. Application Data

[63] Continuation-in-part of Ser. No. 18,727, Mar. 8, 1979, abandoned.

[51] Int. Cl.³ ............................................. A61B 5/05
[52] U.S. Cl. ............................... 128/734; 324/154 R; 324/62
[58] Field of Search .................. 128/734–735, 128/723, 693; 324/15, 62, 154 R, 154 PB, 151 R, 151 A; 336/208

[56] References Cited

U.S. PATENT DOCUMENTS

| | | | |
|---|---|---|---|
| 2,827,041 | 3/1958 | Pierson | 128/734 |
| 2,949,591 | 8/1960 | Craige | 336/208 X |
| 3,290,589 | 12/1966 | Hubbard | 324/62 R |
| 3,452,743 | 7/1969 | Rieke | 128/734 |
| 3,468,302 | 9/1969 | Cowell | 128/734 |
| 3,772,593 | 11/1973 | Sidhu | 128/734 X |
| 3,841,316 | 10/1974 | Meyer | 128/734 |
| 4,016,870 | 4/1977 | Lock | 128/735 |
| 4,024,472 | 5/1977 | Nador et al. | 324/154 R X |

Primary Examiner—Lee S. Cohen
Assistant Examiner—Angela D. Sykes
Attorney, Agent, or Firm—Koda and Androlia

[57] ABSTRACT

In accordance with the invention there is provided an electrical resistance measuring indicating device including a bridge network having on one side thereof a first resistance arm connected to a second resistance arm and on the other side thereof, first voltage arm connected to a second voltage arm, there being between the junction of the first and second resistance arms and the junction of the first and second arms are transisterized amplifier circuit and an undamped indicating means responsive to changes in the balance of the bridge networks so as to indicate or measure the resistance or variation in resistance of a subject such as a body are part connected to the network across one of the resistance arms. The indicating means includes a moving coil meter which includes a metal frame of zero conductivity having a meter coil wound thereon and an indicating needle coupled to the frame.

6 Claims, 4 Drawing Figures

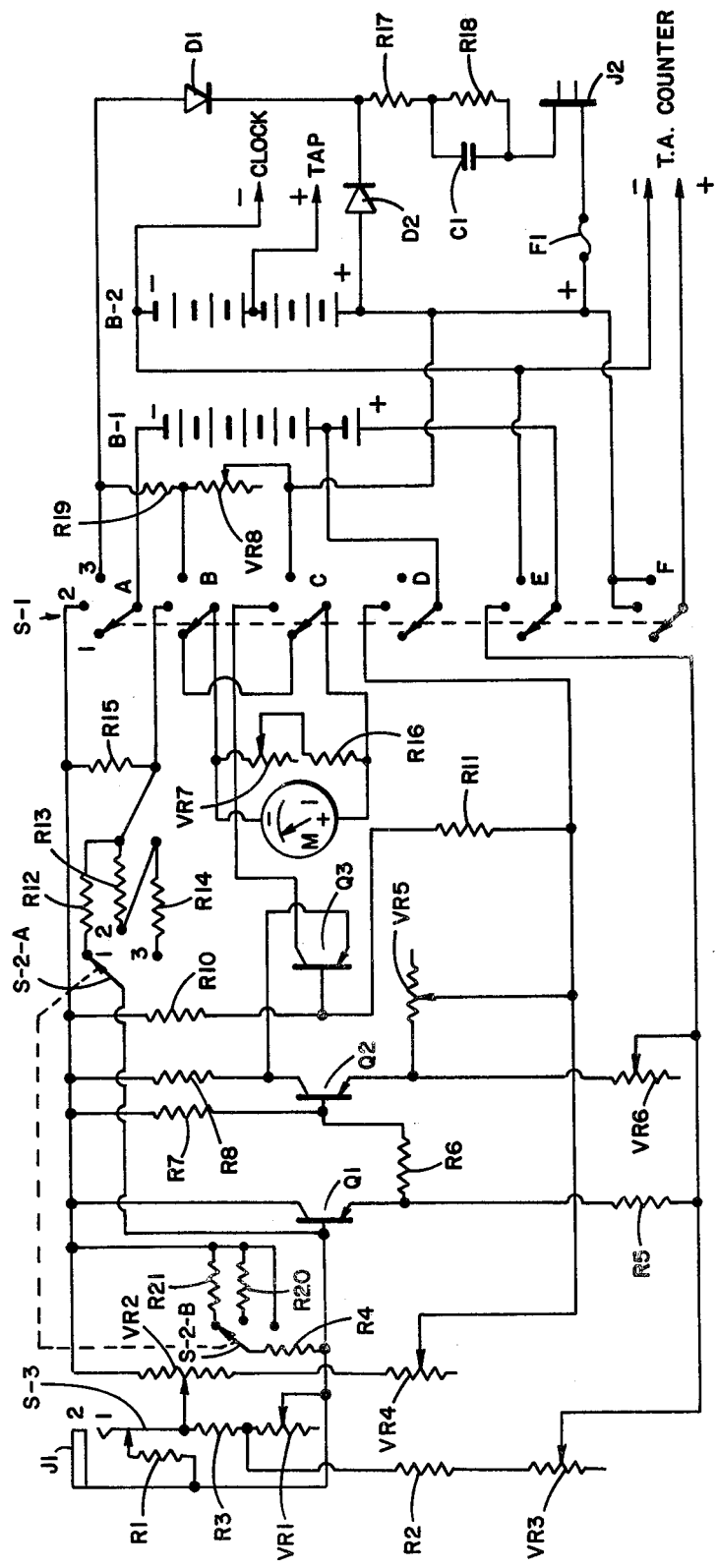

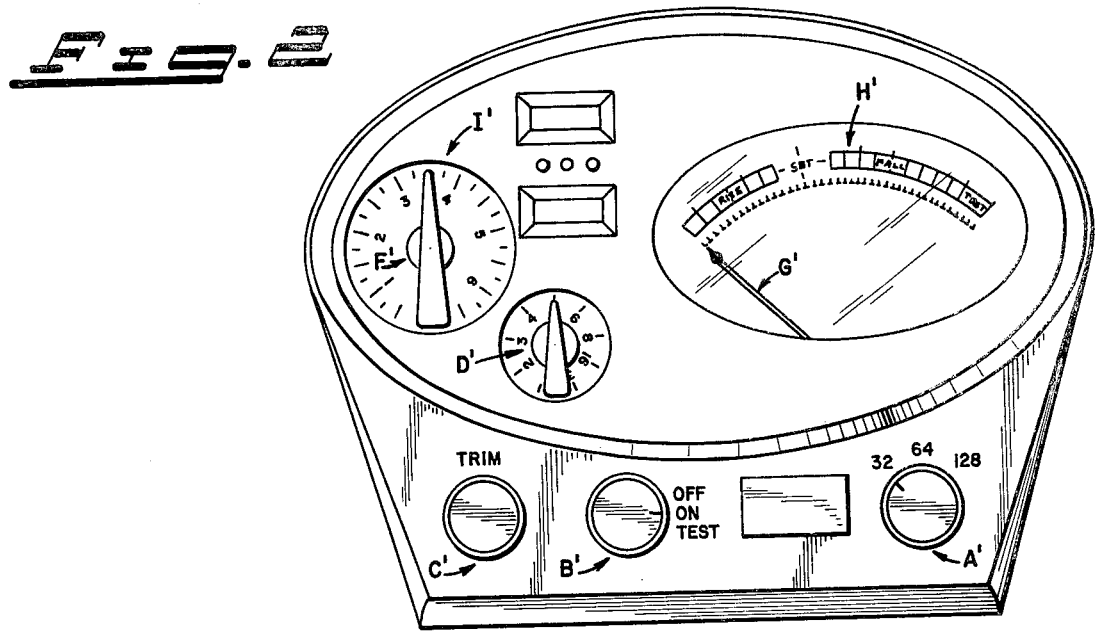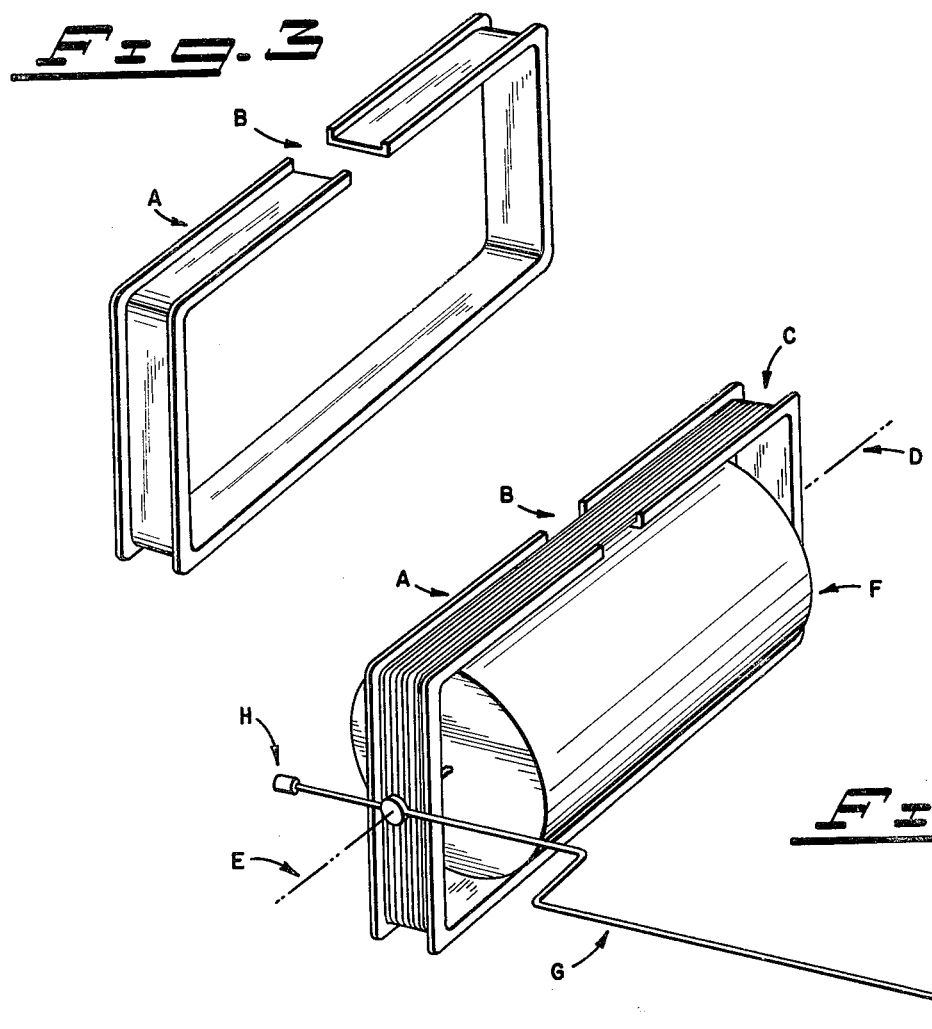

INDICATING DEVICE FOR USE IN A DEVICE FOR MEASURING AND INDICATING CHANGES IN RESISTANCE OF A LIVING BODY

PRIOR APPLICATIONS

This is a continuation-in-part of Ser. No. 18,727 filed on Mar. 8, 1979 which is now abandoned.

BACKGROUND OF THE INVENTION

1. Field of the Invention

This invention relates to the responsiveness of devices for indicating variations in the electrical resistance of the human body.

2. Prior Art

Prior to Lafayette R. Hubbard's, Device for measuring and indicating changes in a living body, resistance measuring devices were not designed to indicate small changes in resistance of a living body. Mr. Hubbard's invention was specifically to be used for measuring these small changes.

Mr. Hubbard's invention while being designed to indicate small changes in resistance of a living body was hampered in that while the circuitry could detect the small changes in resistance, the meter could not accurately track and indicate the changes. To improve the tracking prior art meters were utilized. Such prior art meters improved their tracking by increasing the torque to moment ratio of the movement by decreasing the mass of the needle and by decreasing the mechanical resistance of the movement suspension. Such improved meters while being better still do not sufficiently and accurately track and indicate the changes. In addition, such meters are undesirable since the meter is critically damped so that the needle does not overshoot the level and the decrease in mass of the needle results in a very fine needle which is difficult to see.

SUMMARY OF THE INVENTION

Accordingly, it is a general object of the present invention to provide a highly sensitive device for measuring changes in electrical resistance of a living body with an extremely sensitive meter movement.

It is another object of the present invention to provide a meter for a device for measuring changes in electrical resistance of a living body with substantially improved tracking.

It is yet another object of the present invention to provide a meter for a device for measuring changes in electrical resistance of a living body in which the needle accurately follows the variations in the input signal to the meter.

It is still another object of the present invention to provide a meter for a device for measuring changes in electrical resistance of a living body which is not critically damped.

It is still another object of the present invention to provide an uncritically damped meter for a device for measuring changes in electrical resistance of a living body which includes a frame for the meter movement with zero conductivity.

In accordance with the invention there is provided an electrical resistance measuring or indicating device comprising a bridge network having on one side thereof a first resistance connected to a second resistance arm and on the other side thereof, a first voltage arm connected to a second voltage arm, there being between the junction of the first and second resistance arms and the junction of the first and second arms, a transistorized amplifier circuit and indicating means responsive to changes in balance of the bridge network so as to indicate or measure the resistance, or variations in resistance, of a subject such as a body or part connected to the network across one of said resistance arms.

In a preferred form of the device, a first variable potentiometer means is associated with one of the voltage arms for controlling the range over which the device can operate in the indication of variations in resistance and a second variable potentiometer means is arranged between the junction of the first and second resistance arms and the amplifier circuit, the arrangement being such that when the bridge network becomes unbalanced by the application of a subject thereto, balance can be restored by the adjustment of the first potentiometer means so that the indicating means will respond to very small changes in resistance of said subject. The indication of the changes in resistance must be immediately responsive. Therefore a special meter which has is uncritically damped is utilized. The uncritically damped meter is created by providing a meter coil frame which has zero conductivity.

BRIEF DESCRIPTION OF THE DRAWINGS

For better understanding of the device and the method by which it is to be performed, an embodiment thereof is shown in the accompanying drawings, wherein:

FIG. 1 is a schematic diagram illustrating the circuit of the device.

FIG. 2 is a front view of the device.

FIG. 3 is a perspective view of the frame coil.

FIG. 4 is a perspective view of the meter movement showing the frame coil in use.

DETAILED DESCRIPTION OF THE INVENTION

Referring now to the circuit diagram of FIG. 1, the D.C. amplifier comprises three transistors Q1, Q2 and Q3 which derive their operating power from the battery B1, the transistors each consisting in the present embodiment of a 2N1303 transistor. It will be noted that in FIG. 1, the input to the D.C. amplifier is applied between the base and emitter of the first transistor Q1, the emitter of Q1 being connected to the battery B1 through a 4.7K resistor R5 and and switch S1. This potential difference is equal to the battery voltage so that the circuit behaves exactly as though it were indeed connected as a simple bridge.

Transistor Q1 of the input stage, is an emitter follower having a fairly high input resistance, it being necessary to keep the input resistance of the amplifier high relatively to the resistance of the bridge in order to prevent loading, since loading is particularly important when the bridge is operated in an unbalanced condition.

For the connection of the subject electrodes to the instrument, there is provided a telephone jack J1 having spring contacts adapted to be connected. Upon insertion of an appropriately wired plug (not shown) to the electrodes, contact 2 is connected to the slider of the range control potentiometer VR 2 and is also operatively associated with a single pole switch S3 in such a manner that when the plug is withdrawn, switch S3 closes to connect across the jack contacts 1 and 2, a 5K ohm resistor R1 in place of the subject's body. In the present embodiment, the resistance arms R3 and R2 and VR3, of the bridge comprise resistors of 22K ohms, and 3.8K and 2.5K ohms respectively. The range control potentiometer VR2 is connected at one end to the negative side of the battery B1 through switch SIA and at the other end to the Tap of battery B1 through 5K ohm resistor VR4 and a switch S1D. The base of the transistor Q1 is also connected through resistor RI2 or RI3 or RI4, depending on desired range of sensitivity as selected by S2A, to the negative side of meter M1 and the collector of transistor Q1 is connected through switch S1A to the negative side of battery B1. The emitter of Q1 is connected through a 470 ohm resistor R6 to the base of the second state transistor Q2, the latter being arranged as a conventional common-emitter stage which provides most of the current gain. The emitter of Q2 is connected through a 5K ohms preset variable resistor VR6 to the positive side of batter B1 and this emitter of Q2 is also connected through a sensitivity control VR5 comprising a 10K ohm reverse-log variable resistor and through the switch S10 to the Tap of battery B1. The collector of Q2 is connected directly to the emitter of Q3, and is also connected through a 5.6K ohm resistor R8 and switch S1A to the negative side of battery B1. The base of Q3 is connected to the junction of resistors R10 and R11, each of 22K ohms, R10 being connected through switch S1A to the negative side of battery B1 and the other end of R11 being connected to the slider of resistor VR5. The collector of Q3 is connected to a switch S1C so that by operation of the switch S1C the collector can be connected to the positive side of the meter. The meter is shunted by a 5.6K ohm resistor R16 and a 5K variable resistor VR7 in series, and the negative side thereof is connected through a 22K ohm resistor R15 and switches S1B and S1A to the negative side of the battery B1.

The switch S1C and S1A and S1B, when S1 is in the 3rd position, respectively connects the positive side of the meter M1 to the positive side of B1 and connects the negative side of the meter M1 to the negative side of B1 via a 90K ohm resistor R19. With S1 in the 3rd position the meter is shunted by a 5K ohms variable resistor VR8.

The transistor Q3 of the output stage is connected in the common-base configuration and constitutes an impedance matching device feeding the indicating meter M1.

The resistors R12, R13 and R14 are negative feedback resistors which determine the overall gain. Their value depends upon the position of S2A.

Switch S2 is a double pole treble throw. In position one, a 470K ohm resistor R12 is connected as the feedback resistor. In position 2, a mega ohm resistor R13 is connected as the feedback resistor. In position 3, two one mega ohm resistors R13 and R14 are connected in series as the feedback resistors.

To compensate for the change in potential at the base of Q1, caused by the changing resistances of S2A, a variable opposite potential is applied to the base of Q1 using switch S2B. In position 1, a 200K ohm resistor R4 and a 75K ohm resistor R21 is connected between the base of Q1 and the negative side of B1. In position 3 a 200K ohm resistor R4 is connected between the base of Q and the negative side of B1.

This is a new improvement as it allows for a boosting of the sensitivity not available in the previous device.

Switch S1A, B, C, D, E, F, is a 5 pole treble throw switch operated by knob B' (FIG. 2).

The indicating meter M1 is a moving-coil meter capable of reading from 0 to 100 microamps at full scale deflection, the meter having an arcuate scale H' (FIG. 2) divided into sections. The meter M1 is designed to be undamped and therefore accurately tracks the changes in resistance of the living body and constitutes another improvement since it too improves the sensitivity of the device. The construction of the improved meter M1 will be described later below. At about one-third scale deflection, there is provided a small sector of the arc marked "SET". At the full-scale end of the arc there is another small section marked "TEST". Between these two small sectors, the scale is marked "FALL". The 5K ohm preset variable resistor VR1 is provided between the subject terminals and the amplifier detector, to permit compensation for variations in component values. The resistance value of the optimum female subject is 5K ohms and the instrument is therefore standardized at this value. For the setting of VR1 there is provided a control C' (FIG. 2) marked "TRIM".

The range control potentiometer VR2 has a control knob FE' and a linear scale I' marked from "1" to "6" and extending over an arc of 240°, which is divided into divisions of 48°. In the initial adjustment of the instrument, VR1 is adjusted in such manner that when the input jack plug is withdrawn, and the 5K ohm resistor R1 is thus connected across the input, a balance is established when the range control VR2 is set to "2" on its scale. When this adjustment has been made, the balance point should be at "3" on the range control scale I' of VR2 with a resistance of 12,500 ohms connected across the input. Thus when the instrument is correctly adjusted the meter pointer G' should indicate the center of "SET" sector of the scale when the control E' of VR2 is set to read "2" on its scale. In order to set up the calibration it is a merely necessary to set the control E' to "2", withdraw the plug of the jack J1 and adjust VR1 by means of the control C' to bring the meter pointer to the correct deflection.

With the body of a subject connected to the electrodes, and the range control VR2 adjusted for balance, a fall in the resistance of subject's body will cause the base current of transistor Q1 to change in a negative direction. This increases the current in R5 so that the base of Q2 is also carried negative. This, in turn, makes the emitter of Q3 more positive. The collector current of Q3 then increases and thereby increases the deflection of the meter pointer. If, on the other hand, the body resistance of the subject increases, the base current of Q1 will change in a positive direction and there will be a consequential reduction in the deflection of the meter pointer.

When the bridge is in a balanced condition, there will be 1.5 volts applied to the base of Q1 and the meter pointer G' should indicate the center of the "SET" sector of the scale. The amplifier should be so adjusted that this becomes a virtual zero condition. That is to say, when this condition prevails, variation of amplifier gain should not alter the meter reading. If, however, there is unbalance voltage such that the meter indication is above or below this virtual zero reading, an increase in gain will move the pointer further above or below the zero condition, as the case may be.

The gain of the amplifier is adjusted by means of a knob D' (FIG. 2) of the sensitivity control VR5 which varies the negative feedback applied to transistor Q2, part of the emitter current of Q2 flowing through VR5 and part through the pre-set variable resistor VR6. The latter is adjusted to such a value that, when the meter pointer is at the center of the "SET" sector of the scale, the voltage drop across is just equal to the battery voltage; thus, for this reading and for this reading only, no current flows in VR5 and its setting does not affect the indication of the meter.

Because the instrument is primarily intended for the detection of changes in the body resistance of a human subject, precautions must be taken to minimize changes in the meter deflection due to other causes. Changes due to unstable or noisy transistors are overcome by careful selection of transistors, but a change in gain with change in temperature, which is one of the fundamental characteristics of all transistors, can give rise to a steady drift which may be misleading. To correct for this type of instability, the transistor Q3 is introduced, tapped inside of B1 and across transistor Q2. The emitter of transistor Q3 is connected to the collector of transistor Q2; therefore a voltage drift on the collector of transistor Q2 will produce a compensating voltage change on the emitter of transistor Q3. Thus, transistor Q1 is an emitter follower whose output is delivered to the base of transistor Q2 through resistor R6. The emitter of Q2 receives bias voltage at the junction of resistors VR6 and VR5, adjusted by means of VR5. The base of transistor Q3 receives bias voltage at the junction of resistors R10 and R11. The output current of the amplifier flows from the collector Q3 through the indicating meter M1 with compensation for voltage drift provided by the interconnection of the collector Q2 and the emitter of Q3, as above described.

In FIG. 1, the first stage of the amplifier is an emitter follower and the second and third stages are cascaded in a manner to provide drift compensation, as above described.

When the switch S1, operated by the knob B' is turned to "TEST" (position 3) to disconnect the meter from the amplifier, it operates to place resistor R19 and M1 across the batteries. With the switch S1 in this position, a deflection of the meter scale to the "TEST" sector is obtained only when the batteries are delivering their correct voltage.

Switching S1 to position 3 also connects a half wave rectifier, charging unit, powered at J2 by the 115 volts A.C. The rectifier consists of Diodes D1 and D2 that allow only one direction of the A.C. current to pass. A slow blow fuse F1 is to protect the device in case of high voltage surges. Resistor R17 of 27 ohms protects the batteries from high voltage surges. A capacitor of 0.68 microfarads C1 determines the speed of charging. R18 of 470K ohms drains C1 of charge when the unit is not charging. This is an improvement as nickle cadmium batteries can now be recharged when in the device, where in the original device the batteries had to often be replaced.

Also in the new device much of the static has been eliminated by using wire wound potentiometers and metal strip resistors instead of carbon, which had a tendency to get "dusty" with its own carbon and cause internal surges not related to the living body measured.

The meter movement used in the device for measuring and indicating changes in resistance of a living body is 1450 ohm wire coil C wound on a circular metal frame A. The improvement is based on the inductance of the circular metal frame A absorbing a significant amount of any sudden change of current in the coil C. In a prior art meter, the absorbed energy is lost in setting up a current in the metal frame A, at the Frame A is an inductor of negligable resistance. Thus there is significantly less energy available to deflect the needle G.

In the new movement a small section is cut out of the frame A to prevent the energy of the pulse from becoming lost in the form of current in the frame A as there is now infinite resistance.

This makes for maximum utilization of the energy in instantaneously deflecting the needle. Thus the needle responds quicker and more fully to sudden changes in current.

Referring to FIG. 3, the device comprises a metal frame A, shaped to hold a wire wound coil C, with a split at point B, to reduce the conductivity of the frame A to zero, thus preventing energy loss in the form of current inducted magnetically into the frame A.

Referring to FIG. 4, a 1450 ohm, wire wound coil C, one end of which is electrically connected to point D which is used both as one of the electrical connections for coil C and one of the pivots for frame A and needle G. The other end of coil C is electrically connected to point E which is used for both the electrical connection for coil C and the other pivot for frame A and needle G.

Needle G is physically connected to frame A, and is the indicator of the device for measuring the indicating changes in resistance of a living body. Counter weight H is used to balance needle G at the point needle G is connected to frame A. An iron cylinder F is provided within and is pivotally coupled to the frame A and therefore remains motionless. The iron cylinder F further serves to concentrate the magnetism on which the device operates.

A stationary housing is used (but not shown) to connect the movement electrically, magnetically and physically to the device for measuring and indicating changes in resistance of a living body.

It should be apparent that with the above described construction, a meter is provided which is extremely sensitive to changes in input signal, tracks the input signal accurately and is not critically damped. As a result, the sensitivity and accuracy of the device for indicating changes in resistance of a living body is significantly improved, a result not attainable with the prior art meter construction.

Also a wire wound coil C could be used with no frame A at all, by making the coil C stiff with varnish (a nonconductor). The end product is very similar, i.e. a coil without extra inductance and therefore current flow, in the frame A, and it has demonstrated similar results. However, such a structure requires delicate construction techniques and is not as rugged as a meter with a split frame A.

TABLE

| Input | Original Device | With split frame |
|---|---|---|
| 0.1 to .001 second, high energy pulse | not visible or barely visible | very visible |
| .2 to .01 second, high energy pulse | Visible after a .2 to .5 second lag. Amount of deflection noticably reduced by inductance absorption of pulse. | visible after a .02 to .05 second lag. Amount of deflection not measurable reduced by absorption of pulse. |
| .2 to .01 second, low energy pulse | Invisible or nearly so. | Clearly visible |
| Sudden change to new current flow level | Moves sluggishly after .2 to .5 second lag to new level. | Moves sharply to new level after only .02 to .05 second lag |

It will be understood that the component values indicated above are given purely by way of example, and may be modified as required, according to the nature of the transistors and the particular form of circuit described, as previously indicated, the device hereinbefore described is intended more particularly for use in indicating changes in the body resistance of a human subject, but here again, the circuit and the components thereof may be modified according to the particular use of the device.

We claim:

1. A device for indicating changes in resistance of a living body comprising a bridge network having on one side therof a first resistance arm connected in series with a second resistance arm, and on another side thereof a first voltage arm connected in series with a second voltage arm, there being connected in series between the junction of the first and second resistance arms and the first and second voltage arms a transistorized amplifier circuit and current indicating means showing the changes in balance of said bridge network, two electrodes adapted to be connected to a living body, one of said electrodes being electrically connected to a terminal of one of said resistance arms, whereby said living body is adapted to be connected across said one of the resistance arms, a range control device comprising a potentiometer connected in parallel with said first voltage arm, said potentiometer having a sliding contact electrically connected to a terminal of said first voltage arm, the other of said electrodes being electrically connected to said sliding contact, a variable resistance electrically connected to said one electrode and the junction of the first and second resistance arms, said variable resistance being adjustable to enable a balance to be established in an initial setting of the bridge network, said amplifier circuit comprising a transistor emitter follower and cascaded second and third transistors connected to the output of said emitter follower, the collector of said second transistor being connected to the emitter of said transistor emitter follower and the current indicating means comprising an uncritically damped moving coil meter electrically connected between the collector of the third transistor and the first voltage arm, said uncritically damped moving coil meter consisting of an iron cylinder pivotally supporting a metal frame with zero conductivity having a meter coil wound thereon and an indicator needle fixed to said frame, a sensitivity control branch connected across the second voltage arm and comprising two series-connected resistors, at least one of which is variable, the junction of said series-connected resistors being connected to the emitter of said second transistor, said electrodes being connected directly to the base of the transistor emitter follower, and a resistive negative feedback branch connecting the output of the amplifier circuit to the base of the transistor emitter follower.

2. A device according to claim 1, wherein said metal frame having zero conductivity comprises a split metal coil frame.

3. A device according to claim 1 or 2, wherein said resistive negative feedback branch comprises a plurality of selectable resistors of different values.

4. A device according to claim 3, further comprising a resistive compensating branch provided between said base of said transistor emitter follower and a negative source of electrical power.

5. A device according to claim 4, wherein said resistive negative compensating branch comprises a plurality of selectable resistors which are concurrently selectable with said plurality of resistors of said resistive negative feedback branch whereby changes in potential of the base of said transistor emitter follower caused by selectively changing said resistors of said resistive negative feedback branch are compensated for.

6. A moving coil meter for use in a device for measuring and indicating changes in resistance of a living body comprising:
   a split metal frame having opposite sides;
   a meter coil wound on said split metal frame;
   a stationary iron cylinder pivotally coupled to the opposing sides of said frame; and
   an indicating needle coupled to said frame.

* * * * *